US011380933B2

(12) United States Patent
Fakhri et al.

(10) Patent No.: US 11,380,933 B2
(45) Date of Patent: Jul. 5, 2022

(54) SAFETY TEST METHOD FOR DETERMINATION OF CRITICAL CELL STATES BY INTERNAL SHORT PROVOCATION

(71) Applicants: Robert Bosch GmbH, Stuttgart (DE); GS Yuasa International Ltd., Kyoto (JP)

(72) Inventors: Morteza Fakhri, Stuttgart (DE); Simon Tippmann, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 53 days.

(21) Appl. No.: 15/790,923

(22) Filed: Oct. 23, 2017

(65) Prior Publication Data

US 2018/0123166 A1    May 3, 2018

(30) Foreign Application Priority Data

Oct. 27, 2016  (EP) .................................... 16196041

(51) Int. Cl.
*H01M 10/48*      (2006.01)
*H01M 10/42*      (2006.01)
*H01M 10/0525*    (2010.01)
*G01R 31/396*     (2019.01)
*H01M 50/342*     (2021.01)
*H01M 50/581*     (2021.01)

(52) U.S. Cl.
CPC ...... *H01M 10/0525* (2013.01); *G01R 31/396* (2019.01); *H01M 10/42* (2013.01); *H01M 10/486* (2013.01); *H01M 50/342* (2021.01); *H01M 50/581* (2021.01); *H01M 2200/108* (2013.01)

(58) Field of Classification Search
CPC .......... H01M 10/0525; H01M 10/486; H01M 2/1235; H01M 2/348; H01M 10/42; H01M 2200/108; G01R 31/396
USPC ........................................................... 429/90
See application file for complete search history.

(56) References Cited

U.S. PATENT DOCUMENTS

| 5,525,890 | A | * | 6/1996 | Iwatsu | G01R 31/3648 320/106 |
| 8,163,409 | B2 | * | 4/2012 | Fujikawa | H01M 10/4285 429/61 |
| 8,168,314 | B2 | * | 5/2012 | Fujikawa | H01M 10/48 429/61 |
| 9,746,526 | B2 | * | 8/2017 | Fink | H01M 10/48 |
| 9,748,548 | B2 | * | 8/2017 | Malcolm | H01M 2/206 |
| 2002/0140401 | A1 | | 10/2002 | Watanabe et al. | |
| 2005/0253591 | A1 | * | 11/2005 | Kasamatsu | H01M 10/4285 324/432 |

(Continued)

FOREIGN PATENT DOCUMENTS

JP    2009076270 A    4/2009

*Primary Examiner* — Christian Roldan
(74) *Attorney, Agent, or Firm* — Michael Best & Friedrich LLP

(57) ABSTRACT

A system (10) for testing a battery cell (1) by creating at least one of the effects of internal short circuit within the cell (1) with at least one cathode, at least one anode, at least one sensor (3) and at least one conductive heating element (2), comprising at least one resistive heat element (5), wherein at least the resistive heat element (5) is assembled within the cell (1) for simulating an internal short circuit.

19 Claims, 1 Drawing Sheet

(56) References Cited

U.S. PATENT DOCUMENTS

| | | | | |
|---|---|---|---|---|
| 2007/0122715 | A1* | 5/2007 | Fujino | H01M 2/348 |
| | | | | 429/251 |
| 2008/0186030 | A1* | 8/2008 | Kasamatsu | H01M 10/44 |
| | | | | 324/426 |
| 2009/0286148 | A1* | 11/2009 | Fujikawa | H01M 10/052 |
| | | | | 429/149 |
| 2010/0076704 | A1* | 3/2010 | Liu | H01M 10/48 |
| | | | | 702/63 |
| 2010/0248026 | A1* | 9/2010 | Hinoki | H01M 4/62 |
| | | | | 429/209 |
| 2011/0039133 | A1* | 2/2011 | Lee | H01M 50/581 |
| | | | | 429/7 |
| 2011/0177365 | A1* | 7/2011 | Yasui | H01M 50/213 |
| | | | | 429/61 |
| 2011/0229746 | A1* | 9/2011 | Kessler | H01M 10/482 |
| | | | | 429/90 |
| 2012/0013341 | A1 | 1/2012 | Hermann et al. | |
| 2013/0337311 | A1* | 12/2013 | Itou | C08J 7/0427 |
| | | | | 429/144 |
| 2016/0149196 | A1 | 5/2016 | Fan et al. | |

* cited by examiner

SAFETY TEST METHOD FOR DETERMINATION OF CRITICAL CELL STATES BY INTERNAL SHORT PROVOCATION

BACKGROUND OF THE INVENTION

The invention relates to a system for testing a battery cell by creating at least one internal short circuit within the cell and a method for testing a battery cell by creating at least one internal short circuit within the cell.

Ensuring safety is one of the key issues of high energy storage systems. For lithium-ion cells several safety tests are performed to investigate different failure mechanisms. Nail penetration is one of the most critical test scenarios and serves for reproducing an internal short behavior due to local failures or metallic particles inside the cell. The test conditions for this safety test are defined in different engineer standards. In standardized nail penetration the layers of the cell are penetrated. In contrast to real internal shorts however the size of nail, penetration depth and short power are more severe. The geometric size of the nail and the internal short circuit size are not in relation to one another and further, the damage zones due to nail penetration are not characteristic for internal short circuits.

SUMMARY OF THE INVENTION

A system according to the invention for testing a battery cell by creating at least one internal short circuit within the cell comprises at least one cathode and at least one anode and at least one sensor. Further, the system comprises at least one conductive lead element comprising at least one resistive heat element. Particularly, the resistive heat element can comprise a microheater with a heating element and a spatially resolved temperature sensor. Thereby, the resistive heat element is placed within the cell for provocating, simulating and monitoring an internal short circuit. In general, batteries consist of a cathode electrode which is the positive electrode wherein the cathode releases electrons and an anode electrode which is the negative electrode wherein the anode accepts electrons. Preferably, the cell can represent a lithium-ion cell whereby during the charge of the ion cell lithium-ions are migrating from the cathode to the anode simultaneously with an electron flow in the same direction. During this charging the same process occurs in the opposite direction such that lithium-ions are migrating from the anode to the cathode. Thereby, a sensor can be a sensor detecting a temperature (temperature sensor) and/or a sensor detecting a current (current sensor) and/or a sensor detecting a voltage (voltage sensor). Thereby, the at least one sensor can detect events or changes in the thermal and electrical characteristics of the cell. Further, a sensor produces an output communicating the detected changes, particularly by using electrical or optical signals. Thereby, the sensors can comprise different sensitivities indicating how much the output of the sensor changes when the detected event or change is being measured. Thereby, the sensor can be located at any location within the cell. Preferably, at least one sensor is located near or adjacent to the provocation spot and further sensors distributed in the cell. Preferably, multiple sensors can be assembled within the cell to exactly detect the at least one internal short circuit at any location within the cell. Advantageously, the sensor is located in the vicinity of the conductive heating element/resistive element. Thereby, the sensors control provocation of thermal runaway and characterization of related cell behavior by further implementations of sensors is possible. Further, a determination of the cell state is variable for different internal short circuits. Moreover, at least one conductive element is located within the cell comprising at least one resistive heat element. The at least one resistive heat element is placed within the cell for provocation and simulation an internal short circuit. A triggering of critical states by micro-elements inside the cell replaces an external triggering of critical states like for example by nail penetration. Further, the heat element can provoke an internal short circuit with controllable parameters and dimensions wherein the local temperature at the heating spot averages to approximately 200° C. to 1,500° C. Further, the dissipation power is controllable in parameter and dimension by the resistive heat element. Further, the resistive heat element can be located at any position within the cell. Moreover, the use of multiple heat elements is possible which can be located at any positions within the cell. Thereby, the geometric dimension corresponding to the contamination size can be determined. In addition the geometric dimension of the heat element can be adjusted to match real contamination sizes and positions. Further, the sensors and also the resistive heat elements are placed within the cell during an assembly of the cell. Advantageously, they have a preferably wired connection to the outside of the cell whereby for example a trigger to induce a current flow to the heating element leading to a temperature rise. Particularly the temperature change of the sensors is measured by providing an electrical feedthrough and the signals can be evaluated and/or analyzed. Advantageously, this system for testing a battery cell can control a provocation of a thermal runaway and a characterization of related cell behavior can be established. Further, advantageously an internal short circuit is created by an internal event like the generation of heat and not by an external electric or mechanic stimulus. Advantageously, the system can be implemented in all different cell types from pouch cells and/or cylindrical cells and/or prismatic cells with different internal stack designs. By defining the position of the resistive heat element, the position of the internal short circuit within the cell can be set in advance. Positions in the middle of the cell as well as at the edges of the cell are possible. By choosing the size of the resistive heat element, the size of the area in which the resistive heat element is positioned therefore the size and the location of the internal short circuit can be directly influenced and defined. Consequently, it is possible to initially cycle and characterize a healthy cell and subsequently cause an internal short circuit in a desired time. A further advantage of the present system is the possibility to create realistic internal short circuits within the cell, particularly in lithium-ion cells on demand. In contrast to other techniques to intentionally create an internal short circuit the healthy cell can be initially characterized previously, subsequently and during the short circuit and an internal short circuit can be created at a desired time. Using this technique, developed detection and actuation mechanisms can be tested and the effectiveness of an internal short circuit can be confirmed. Furthermore, the temperature can be exactly influenced leading to a particular internal short circuit that can be determined and controlled. Furthermore, even the exact location of the induced internal short circuit can be chosen via a positioning of the resistive heat element. Thereby, the internal short circuit can be applied to all kinds of cell formats.

Further, features and details of the invention result from the dependent claims, the description and the drawings. Thereby, the features and details which are described corresponding to the system according to the invention naturally also apply corresponding to the method according to the invention and vice versa so that according to the disclosure of the single aspects of the invention it can always be reciprocally related to.

Further, it is possible within the scope of the present invention that the resistive heat element comprises a microheater, particularly an adjustable microheater. Preferably, the adjustable microheater has the size of real particles which normally cause an internal short circuit. Due to the size of the adjustable microheater being adjusted to the size of real particles, the internal short circuit can be induced under realistic conditions instead of large area concepts for internal short circuit provocations or nail penetrations which are always greater than 2 mm in diameter. The general size of real particles, however, is normally smaller than 1 mm. Preferably, the microheater comprises a size of 0.05 mm$^2$ to approximately 3 mm$^2$.

Further, it is possible within the scope of the present invention that the cell comprises at least one connection contact for the resistive heat element. Alternatively and/or additionally, is it possible within the scope of the present invention that the cell comprises at least one connecting contact for the sensor. Both connecting contacts are preferably assembled on the outside of the battery cell. Therefore, the connecting contacts serve for conducting signals in both directions from the external side of the battery into the internal side of the battery or from the internal side of the battery to the external side of the battery. Thereby, for example a stimulus can be conducted to the resistive heat element, preferably to the microheater, leading to a heating of the microheater, namely an increase in the temperature. Further, it is possible that the sensor detects the heat elevation and/or performance within the cell and conducts a signal to the outside of the cell where the signal can be analyzed or investigated. Further, it is possible that to the connecting contacts electrical components can be connected like for example an analyzing device or power source etc.

Advantageously, it is possible that the resistive heat element is approximately 0.0025 mm$^2$ to approximately 10 mm$^2$, particularly approximately 0.05 mm$^2$ to approximately 3 mm$^2$. Thereby, the resistive heat element consists of two support elements comprising a microheater at one edge of the support elements. Preferably, the size of the microheater corresponds to the size of the particles which can cause an internal short circuit.

Advantageously, the conductive heating element/resistive element, particularly the microheater, comprises at least one of the following: copper, aluminum, iron, chromium, nickel, manganese, lithium or a combination thereof. Copper comprises thereby a high electric connectivity, high thermal connectivity and further a low hardness and high ductility of single crystals. Besides, copper is easy to handle and a good source of single metal particles. Aluminum is further a relatively soft, durable, light-weighted, ductile and malleable metal which is non-magnetic and not easy to ignite. Therefore, the use of aluminum is easy, cost efficient and safe. Iron is a placable metal which can comprise different degrees of hardness and/or softness depending on the purity of the metal ions and is further resistant to high pressures and temperatures. Therefore, iron is easy to handle and cost efficient to use. Nickel is further resistant to high corrosion and oxidizes very slowly at room temperature. Therefore, nickel is resistant and long lasting to use. Manganese is a hard metal which is easy to oxidize and hard to form. Therefore, manganese is a resistant metal comprising robust properties. Lithium is a very light metal as well as a dense solid chemical element. Lithium is further highly reactive and flammable. Preferably, lithium has a single valance electron that is easily given up to form a cation and therefore, lithium is a good conductor of heat electricity as well as a highly reactive element. Chromium is a hard and brittle metal which takes a high-polish, resists tarnishing and has a high melting point. Further, chromium is remarkable for his magnetic properties, it is the only solid element which shows antiferromagnetic altering at room temperature. Further, chromium metal left standing in air is passivated by oxidation, forming a thin, protective, surface layer. This layer is very dense and prevents the diffusion of oxygen into underlying metals. Further, chromium is stable against acids. Advantageously, a combination of any of said metals is possible.

Another aspect of the present invention is a method for testing a battery cell by creating at least one internal short circuit within the cell. Further, the cell comprises at least one cathode, at least one anode and at least one conductive heating element/resistive element comprising at least one resistive heat element and at least one sensor, particularly a temperature sensor. Further, the method comprises the following steps:

a) assembly of the heat element within the battery cell,
b) input of internal short power at the resistive heat element,
c) determination of the state of the cell.

The assembly of the heat element within the cell occurs preferably during the assembly of the cell itself. Thereby, the heat element can be placed at any position within the cell depending on the position where the internal short circuit is triggered. Further, the assembly of multiple heat elements within the cell is possible whereby multiple internal short circuits at different positions can be induced, preferably at the same time. Further, the input of the internal short circuit resistive heat element induces the activation of the resistive heat element. Thereby, a temperature is created which is preferably in the range of approximately 200° C. to 1,500° C. Further, the state of the cell is determined. The determination preferably occurs by at least one sensor which is located within the cell. Thereby, it is an advantage when the sensor is assembled in the vicinity of the resistive heat element, preferably the microheater, in order to sense the elevation of temperature at the resistive heat element and therewith at the position of the internal short circuit.

Further, it is conceivable that in a step a.1) at least one sensor, particularly a temperature sensor is inserted into a cell for measuring at least one internal temperature at at least one position within the cell. Thereby, the temperature measurement occurs preferably in the vicinity of the resistive heat element, preferably the microheater, since the internal short circuit is triggered by the resistive heat element. Thereby, the sensor can detect any changes of the environment directly at the point of interest, namely the position of the internal short circuit.

Further, it is conceivable that in a step c.1) the determination of the state of the cell is determined by measuring an internal temperature by the sensor at at least one position within the cell and at least one external temperature. In order to measure the temperature within the cell it is advantageous to measure a reference temperature outside the cell detecting a delta between the temperature within the cell and the temperature in the environment, namely the outside of the cell. Thereby, high temperature at the outside of the cell can have influence in the temperature at the inside of the cell. For example, if the surrounding of the cell is heated up to high temperature, the internal temperature of the cell is likewise increased such that an internal short circuit becomes more likely. On the other hand, a very low external temperature may also cool down the interior of the cell such that the currents of an internal short circuit need more power, which means that a greater heat elevation within the cell to induce the internal short circuit is beneficial.

Further, it is possible with the method according to the invention that the conductive heat element is assembled at a selectable position within the cell during the assembly of the cell for performing a method at any position within the cell. Thereby, the conductive heating element resistive element can be assembled at any position within the cell. To characterize the cell, it is advantageous to induce internal short circuits at different positions within different cells in order to characterize the behavior of a certain cell type.

Moreover, it is conceivable in a step d) that the state of the cell is identified in order to determine the properties of the internal short circuit. Additionally or alternatively, it is conceivable that the cell is opened in order to determine the properties of an internal short circuit. In order to identify the state of the cell, the properties of the internal short circuit can be preferably identified via the sensors which are likewise positioned within the cell, preferably in the vicinity of the conductive heating element/resistive element where the internal short circuit probably occurs. Thereby, the sensors preferably sent signals to a device outside the cell, preferably an analyzing device which analyzes for example the temperature inducing an internal short circuit or the time after reaching a certain temperature until the internal short circuit is triggered. Further, not only an analyzing device can be used but also the cell can be opened after an internal short circuit took place wherein the structure damages within the cell can be examined.

The steps of the method can preferably be executed in any order, however, preferably in an alphabetic order from a) to b), a) to c) or b) to c).

BRIEF DESCRIPTION OF THE DRAWINGS

Further advantages, features and details of the invention result from the following description in which with reference to the drawings the embodiments of the invention are described in detail. Thereby, the features described in the claims and in the description can each individually or in any combination be essential for the invention. It is shown:

DETAILED DESCRIPTION

In different figures, the same features always correspond to the same reference signs, therefore generally the features are only described once.

Figure 1:
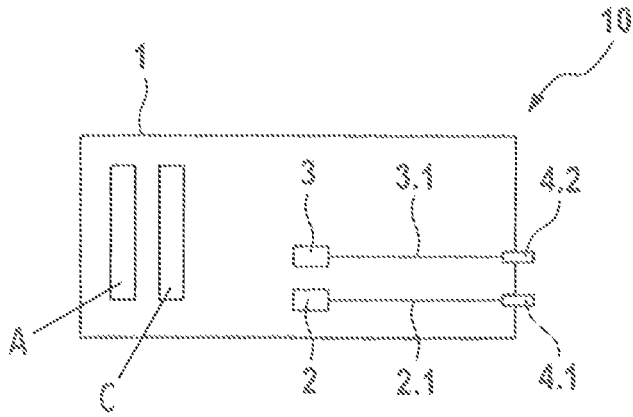
FIG. 1 a schematic illustration of a cell according to the invention

FIG. 1 shows a system 10 for testing a battery cell 1 comprising an anode A, a cathode C and at least one conductive heating element/resistive element 2 and at least one sensor 3. The at least one conductive heat element 2 is assembled within the cell for monitoring an internal short circuit. Thereby, the conductive heating element/resistive element 2 can be assembled at any position within the cell depending on the position which should be further examined due to an internal short circuit. Further, a connecting contact 4.1 is assembled at the battery cell 1 providing an interaction between the conductive heating element/resistive element 2 within the cell 1 and the exterior of the cell 1. A wire 2.1 establishes a connection between the conductive heating element/resistive element 2 and the connecting contact 4.1. At the connecting contact 4.1 further devices like for example a power source can be assembled in order to provide power for the conductive heating element/resistive element. Further, at least one sensor 3 is assembled within the cell. The sensor 3 can be assembled at any position within the cell 1, preferably in vicinity of the conductive heating element/resistive element 2. Thereby, the sensor 3 senses changes in the environment surrounding the sensor 3. Therefore, it is an advantage when the sensor 3 is located in the vicinity of the conductive heating element/resistive element 2, since the sensor 3 can therewith easily detect an internal short circuit without a temporal delay. Via a connecting contact 4.2 the sensor 3 has a connection to the exterior of the cell. Thereby, at the connecting contact 4.2 further devices can be assembles like for example an analyzing device which detects, analyzes or monitors the changes of the conditions within the cell surrounding the sensor 3. Thereby, a connection between the sensor 3 and the connecting contact 4.2 is established via a wire 3.1 leading the signals from the sensor 3 to the outside of the cell 1.

Figure 2:
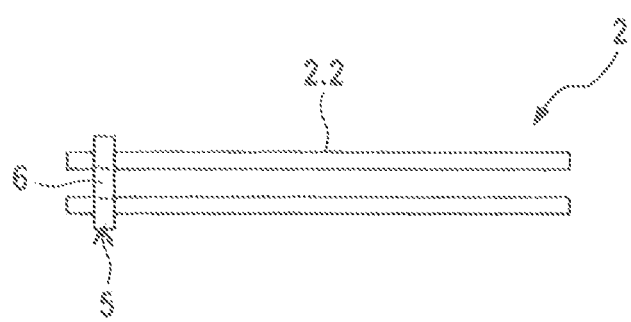
FIG. 2 a schematic illustration of the conductive heating element/resistive element FIG. 3 a schematic illustration of a method according to the invention

FIG. 2 shows a conductive heat element 2 comprising at least two conductor portions 2.2 and a resistive heat element 5, preferably at one edge of the conductor portion 2.2. The resistive heat element 5 thereby is the part of the conductive heating element/resistive element 2 where the temperature can be actually increased. Further, the resistive heat element 5 comprises a microheater 6 assembled between the at least two conductor portions 2.2. This microheater 6 is preferably the only part of the conductive heating element/resistive element 2 which is heated up. Thereby, the distance between the conductor portions 2.2 and the size of the microheater 6 can be varied depending on the actual particle size which should be simulated and examined. Depending on the particle size an internal short circuit comprises different characteristics. Thereby, it is an advantage when the size of the microheater 6 can be differed and adjusted to a particle size which should be examined. Thereby, preferably the particle size and therefore the size of the microheater 6 is smaller than 3 $mm^2$. Further, a microheater 6 can be heated to temperatures up to 200° C. to 1,500° C.

Figure 3:
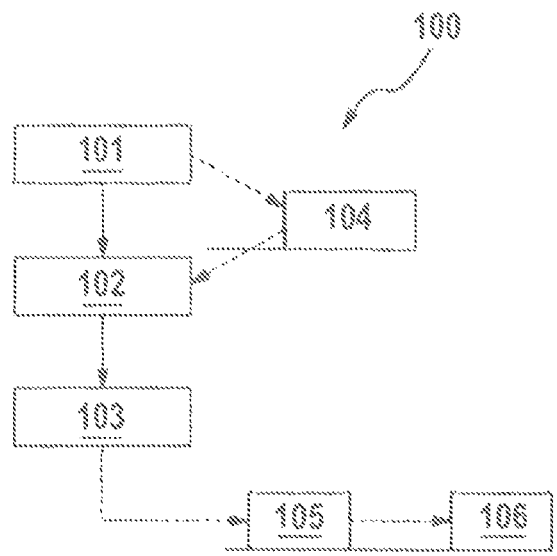

FIG. 3 shows a flowchart displaying a method 100 according to the present invention. The method 100 can preferably start with the assembly 101 of the resistive heat element 5 within the cell 1. This assembly 101 occurs preferably during the production of the cell 1 and/or during a first charging of the cell 1. In a further step an input 102 of internal short power at the resistive heat element 5 occurs. This is induced by generating an external current. Thereby, the resistive heat element 5, particularly the microheater 6, develops a heat, preferably a temperature between 200° C. and 1,500° C. Thereby, an internal short circuit within the cell 1 is triggered which can be further characterized. In a further step, the determination 103 of the state of the cell 1 can be performed. This determination can be either performed by the sensor 3 whose signals can be examined or monitored by an analyzing device outside the cell or in a further step by an identification 105 of the properties of the internal short circuit. Depending on the particle size, namely the size of the microheater 6 representing a desired particle size which should be examined, the characteristics depending on different particle sizes can be characterized. Thereby, for example properties like the quantity or the quality of damage like the size of the damage or the intensity of the damage can be examined. Further, in another step the opening 106 of the cell 1 can be performed in order to determine the properties of the internal short circuit. Further, by opening not only the signals send by the sensor but also a visual inspection of the interior of the cell 1 and therewith the possible damage of the cell 1 can be examined.

The method described in FIG. 3 can particularly be realized with a system of the embodiments shown in FIGS. 1 and 2.

The previous description of the embodiments describes the present invention only within the scope of examples. Naturally, also single features of the embodiment as far as they can be meaningful can be freely combined with one another without leaving the scope of the invention.

The invention claimed is:

1. A method (100) for testing a battery cell (1) by creating at least one internal short circuit within the battery cell (1), the battery cell comprising at least one cathode, at least one anode, at least one sensor (3), and at least one conductive heating element (2) that includes at least one resistive heat element (5), the method comprising the following steps:
   a) selecting at least one position within the battery cell (1) where the at least one resistive heat element (5) is to be assembled and the at least one internal short circuit within the battery cell (1) is to be created, and selecting a size of the at least one resistive heat element (5) corresponding to a size of real particles which can cause the at least one internal short circuit,
   b) assembling (101) the at least one cathode, the at least one anode, the at least one sensor (3), and the at least one resistive heat element (5) within the battery cell (1) during an assembly of the battery cell (1) itself,
   wherein the at least one resistive heat element (5) comprises a microheater (6) disposed within the battery cell (1),
   wherein the at least one resistive heat element (5) further includes a wire connection connecting the at least one resistive heat element (5) with a connecting contact leading to the outside of the cell,
   whereby a trigger to induce a current flow to the at least one resistive heat element (5) leads to a temperature rise,
   c) inputting (102) an internal short power by the current flow to induce activation of the at least one resistive heat element (5) thereby the temperature rise is created which is preferably in a range of approximately 200° C. to 1,500° C.,
   wherein the temperature rise creates the at least one internal short circuit at the at least one position within the battery cell (1), and
   d) determining (103) the state of the battery cell (1), wherein a type of the battery cell (1) is a pouch cell, a cylindrical cell or a prismatic cell.

2. A method (100) for testing a battery cell (1) by creating at least one internal short circuit within the battery cell (1), the battery cell comprising at least one cathode, at least one anode, at least one sensor (3), and at least one conductive heating element (2) that includes at least one resistive heat element (5), the method comprising the following steps:
   a) selecting at least one position within the battery cell (1) where the at least one resistive heat element (5) is to be assembled and the at least one internal short circuit within the battery cell (1) is to be created, and selecting a size of the at least one resistive heat element (5) corresponding to a size of real particles which can cause the at least one internal short circuit,
   b) assembling (101) the at least one cathode, the at least one anode, the at least one sensor (3), and the at least one resistive heat element (5) within the battery cell (1) during an assembly of the battery cell (1) itself,
   connection connecting the at least one resistive heat element (5) with a connecting contact leading to the outside of the cell,
   whereby a trigger to induce a current flow to the at least one resistive heat element (5) leads to a temperature rise,
   c) inputting (102) an internal short power by the current flow to induce activation of the at least one resistive heat element (5) whereby the temperature rise is created which is in a range of approximately 200° C. to 1,500° C.,
   wherein the temperature rise creates the at least one internal short circuit at the at least one position within the battery cell (1), and
   d) determining (103) the state of the battery cell (1), wherein a type of the battery cell (1) is a pouch cell, a cylindrical cell or a prismatic cell.

3. The method (100) according to claim 2, wherein the step of assembling the at least one sensor (3) within the battery cell (1) includes inserting the at least one sensor (3) into the battery cell (1) for measuring (104) at least one internal temperature at at least one position within the battery cell (1).

4. The method (100) according to claim 2, including in a step d.1) determining the state of the battery cell by measuring (104) an internal temperature by the at least one sensor (3) at at least one position within the battery cell (1), and by measuring at least one external temperature.

5. The method (100) according to claim 2, including identifying the state of the battery cell (1) in order to determine the properties of the at least one internal short circuit.

6. The method (100) according to claim 2, characterized in that the at least one sensor (3) is a temperature sensor (3).

7. The method (100) according to claim 6, wherein the step of assembling the at least one sensor (3) within the battery cell (1) includes inserting the temperature sensor (3) into the battery cell (1) for measuring (104) at least one internal temperature at at least one position within the battery cell (1).

8. The method (100) according to claim 2, including opening the battery cell (1) in order to determine the properties of an internal short circuit.

9. The method (100) according to claim 8, including in a step c) identifying the state of the battery cell (1) in order to determine the properties of the at least one internal short circuit.

10. The method (100) according to claim 2, wherein the at least one resistive heat element (5) within the battery cell (1) includes a microheater (6) disposed within the battery cell (1).

11. The method (100) according to claim 10, characterized in that the size of the microheater (6) is approximately 0.0025 mm$^2$ to approximately 10 mm$^2$.

12. The method (100) according to claim 10, characterized in that the size of the microheater (6) is approximately 0.05 mm$^2$ to approximately 3 mm$^2$.

13. The method (100) according to claim 3, including in a step b.1) inserting multiple sensors (3) into the battery cell (1) during assembly of the battery cell (1) for measuring at least one from a group consisting of current and voltage within the battery cell (1).

14. The method (100) according to claim 3, including in a step b.1) inserting multiple sensors (3) into the battery cell (1) during the assembly of the battery cell (1) for measuring temperature within the battery cell (1), and at least one from a group consisting of current and voltage within the battery cell (1).

15. The method (100) according to claim 10, wherein the microheater provides heat to trigger the at least one internal short circuit within the battery cell (1).

16. The method (100) according to claim 10, wherein the microheater includes at least one of a group comprising: copper, aluminum, iron, chromium, nickel, manganese, lithium or a combination thereof.

17. The method (100) according to claim 12, wherein the microheater provides heat to trigger the at least one internal short circuit within the battery cell (1).

18. The method (100) according to claim 12, wherein the microheater includes at least one of a group comprising: copper, aluminum, iron, chromium, nickel, manganese, lithium or a combination thereof.

19. The method (100) according to claim 7, wherein a wire (3.1) that is disposed within the battery cell (1) connects the temperature sensor (3) to a connecting contact (4.2) to provide signals from the at least one temperature sensor (3) to a device outside of the battery cell (1) that monitors changes of conditions with the battery cell (1).

* * * * *